United States Patent [19]

Baxter et al.

[11] Patent Number: 5,793,792

[45] Date of Patent: Aug. 11, 1998

[54] LASER ASSEMBLY WITH INTEGRAL BEAM-SHAPING LENS

[75] Inventors: Kevin A. Baxter, Billerica; Douglas S. Goodman, Sudbury, both of Mass.

[73] Assignee: Polaroid Corporation, Cambridge, Mass.

[21] Appl. No.: 861,243

[22] Filed: May 21, 1997

Related U.S. Application Data

[63] Continuation of Ser. No. 643,421, May 8, 1996, abandoned.

[51] Int. Cl.⁶ .................................................. H01S 3/08
[52] U.S. Cl. .......................... 372/107; 372/36; 372/101; 372/92; 372/108
[58] Field of Search ............................ 372/107, 36, 101, 372/99, 98, 92, 108

[56] References Cited

U.S. PATENT DOCUMENTS

| | | | |
|---|---|---|---|
| 5,181,216 | 1/1993 | Ackerman et al. | 372/36 |
| 5,420,722 | 5/1995 | Bielak | 359/708 |
| 5,426,533 | 6/1995 | Wallace | 359/710 |
| 5,436,990 | 7/1995 | Head et al. | 385/34 |
| 5,572,543 | 11/1996 | Heinemann et al. | 372/107 |
| 5,596,590 | 1/1997 | deRuyter et al. | 372/107 |
| 5,617,492 | 4/1997 | Beach et al. | 385/33 |

OTHER PUBLICATIONS

Raymond J. Beach et al., "Improved performance of high average power semiconductor arrays for applications in diode pumped solid state lasers," SPIE v. 2148 (1994), pp. 13–29.

Raymond J. Beach, "Theory and optimization of lens ducts," Applied Optics, vol. 35, No. 12, 20 Apr. 1996, pp. 2005–2015.

Primary Examiner—Leon Scott, Jr.
Attorney, Agent, or Firm—Joseph Stecewycz

[57] ABSTRACT

A laser assembly is disclosed comprising a heatsink, a laser device attached to a mounting surface of the heatsink, and a beam-shaping lens attached to an oblique surface of the heatsink, the oblique surface intersecting with the mounting surface to form an obtuse dihedral angle. The beam-shaping lens comprises a canted attachment surface which, when placed against the oblique surface, serves to optimally position the lens in relation to the laser device.

16 Claims, 3 Drawing Sheets

LASER ASSEMBLY WITH INTEGRAL BEAM-SHAPING LENS

CROSS REFERENCE TO RELATED APPLICATION

This application is related to the concurrently filed U.S. patent application entitled "Heatsink for a semiconductor laser." by Kevin A. Baxter and Ferdynand P. Dabkowski. This application is a continuation of Ser. No. 08/643,921 filed May 08, 1996 now abandoned (Feb. 29, 1997).

FIELD OF THE INVENTION

This invention relates to semiconductor laser systems and, more particularly, to a laser assembly having an integral beam-shaping lens.

BACKGROUND OF THE INVENTION

Semiconductor laser devices are widely used in applications where there is need for an efficient, high-power radiation source. Such applications include graphic displays, printers, medical diagnostic products, and optical data storage systems. The laser device can be a single source, such as a laser diode, or may comprise multiple sources, such as a laser diode array. The radiation emitted from such laser devices is typically not symmetric, the divergence of the emission from a lasing source usually being greater in the transverse direction (i.e., normal to the plane of the active layer) than in the lateral direction. Consequently, in many such applications the nonsymmetrical laser emission is reshaped at the source into a beam having a different divergence, typically by an anamorphic optical element. For example, a toroidal lens may be used to produce a spot from a laser diode, or a cylindrical lens may be used with a laser array to form a beam which is collimated in one meridian. As is well-known in the relevant art, a toroidal lens has at least one lens surface curved along each of two substantially perpendicular axes, where the two curvatures are different, and a cylindrical lens is a toroidal lens with one curvature having an infinite radius.

In a conventional laser assembly, the laser device is mounted on a heatsink, which serves to conduct away waste heat generated by the laser device, and the beam-shaping lens is mounted to a separate lens support located on or near the heatsink. A lens-positioning procedure is normally performed during manufacture of the laser assembly to compensate for the tolerances present in the fabrication and assembly of the laser device, heatsink, lens, and lens support. A typical procedure will include an adjustment of the lens relative to the lens support and a separate adjustment of the lens support relative to the laser. After the lens and the lens support have been optimally positioned, such that the desired beam characteristics are obtained, they are permanently secured in place. It is necessary that both the lens and the lens support element remain in position during operation of the laser device; otherwise, performance of the laser assembly may be adversely affected.

If the laser device operates at a relatively high power level, the waste heat generated by the laser device will produce a thermal gradient in the heatsink which may extend into and produce a distortion of the lens support. A similar distortion can be produced by temperature sources present in the operating environment of laser assembly. This distortion can result in movement of the lens relative to the laser device and may cause a degradation in the performance of the laser assembly. Moreover, if the lens support configuration results in multiple degrees of freedom between the laser device and the lens, optimal lens position may not be maintained if the laser assembly is subjected to vibrational forces. What is needed is a laser assembly in which the presence of heat sources or vibrational forces does not effectively distort the lens support and, therefore, does not affect the optimal position of the beam-shaping lens. It is therefore an object of the present invention to provide a laser assembly in which the lens support is largely unaffected by waste heat.

It is a further object of the present invention to provide such a laser assembly having a reduced number of degrees of freedom between the laser device and the beam-shaping lens.

It is a further object of the present invention to provide such a laser assembly in which the procedure for achieving optimal lens position is simplified.

Other objects of the invention will, in part, appear hereinafter and will, in part, be apparent when the following detailed description is read in connection with the drawings.

SUMMARY OF THE INVENTION

The present invention is a laser assembly comprising a laser device, a heatsink, and a beam-shaping lens for modifying the output emission of the laser device. The heatsink comprises a mounting surface and an oblique surface, the surfaces intersecting at a common edge to form an obtuse dihedral angle. The laser device is attached to the mounting surface proximate the common edge. The beam-shaping lens is positioned in the path of the laser output emission by securing a canted attachment surface of the lens to the oblique surface.

BRIEF DESCRIPTION OF THE DRAWINGS

The novel features that are considered characteristic of the present invention are set forth with particularity herein. The organization and method of operation of the invention, together with other object and advantages thereof, will be best understood from the following description of the illustrated embodiments when read in conjunction with the accompanying drawings wherein.

DETAILED DESCRIPTION OF THE INVENTION

Figure 1:
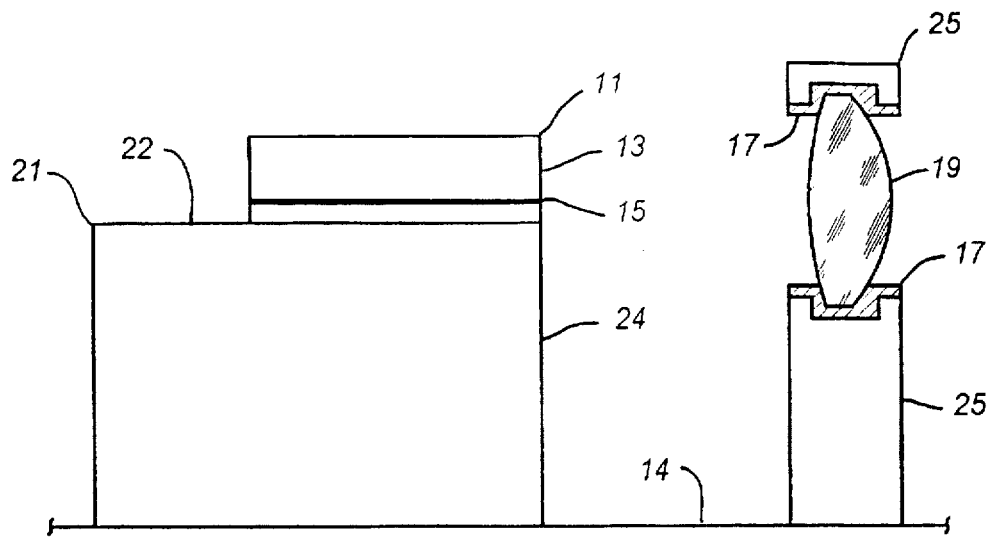
FIG. 1 is a diagrammatic side elevation view of a conventional semiconductor laser assembly comprising a beam-shaping lens mounted to a pedestal-type support element.

FIG. 1 is a simplified side elevation view of a conventional laser assembly 10 comprising a laser device 11 secured to a mounting surface 22 of a rectangular laser heatsink 21. The radiation emitted from laser device 11 is reshaped by a beam-shaping lens 19. As is commonly practiced in the art, laser device 11 is oriented with an active layer 15 adjacent to mounting surface 22 and positioned with an output facet 13 generally coplanar with a front surface 24 of heatsink 21. Lens 19 is retained in position by means of a pedestal-type lens support 25. Both heatsink 21 and lens support 25 are attached to a base surface 14. The optimal position of lens 19 is determined by: i) a longitudinal adjustment of lens support 25 along base surface 14 so as to achieve the output radiation pattern desired; and ii) a transverse adjustment of lens 19 relative to lens support 25 so as to bring lens 19 into alignment with the output radiation of laser device 11. To provide for the adjustment of lens 19 within lens support 25, there may be a thick layer of adhesive 17, or another method of adjustment, such as a by tightening a clamp or inserting a shim (not shown).

When laser assembly 10 is operating, laser device 11 produces waste heat which is conducted away by heatsink 21. Some of this waste heat can flow into lens support 25 and adhesive 17 and produce distortion of these elements. For example, waste heat may cause a bending of lens support 25 and affect the longitudinal position of lens 19, or it may cause an expansion of adhesive 17 and produce a shift or rotation of lens 19. A similar lens repositioning can be caused by one or more heat sources present in the operating environment of the laser assembly.

In the conventional configuration shown, there are multiple degrees of freedom between lens 19 and laser device 11. For example, base surface 14 can flex, lens support 25 can bend in one or more directions, and lens 19 can shift within lens support 25. Consequently, the structural integrity of laser assembly 10 may be inadequate to maintain an optimal positional relationship between lens 19 and laser device 11 in an operating environment with vibrational forces or sources of heat.

Figure 2:
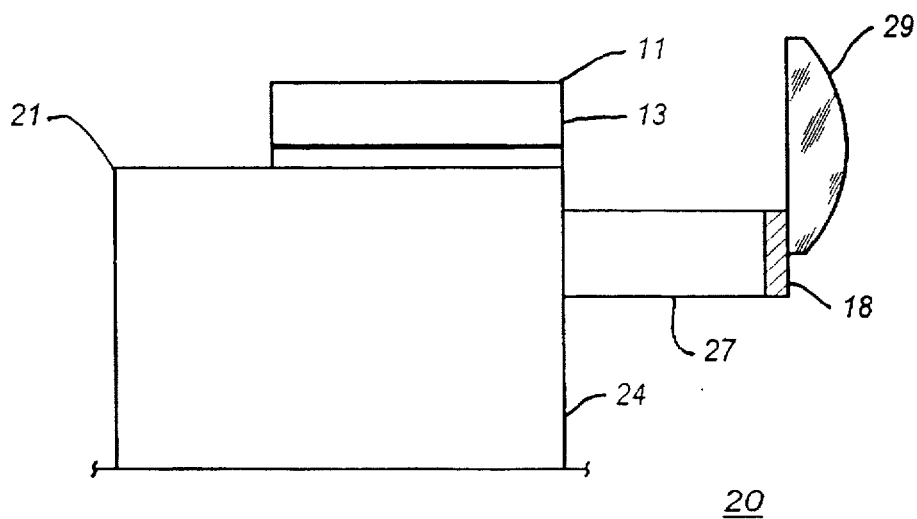
FIG. 2 is a diagrammatic side elevation view of a conventional semiconductor laser assembly comprising a beam-shaping lens mounted to a cantilever-type support element.

FIG. 2 is a simplified side elevation view of a laser assembly 20 illustrating another conventional lens-mounting configuration. Laser assembly 20 comprises a cantilever-type lens support 27 attached directly to front surface 24 of heatsink 21. The radiation emitted from laser device 11 is reshaped by a beam-shaping lens 29. The optimal position of lens 29 is determined by: i) a transverse adjustment of lens support 27 along front surface 24 to bring lens 29 into alignment with the output radiation of laser device 11; and, ii) a longitudinal adjustment of lens 29 relative to lens support 27 to achieve the output radiation pattern desired. A thick layer of adhesive 18 is typically used on lens support 27 to provide for the adjustment of lens 29.

Waste heat produced by laser device 11 or another heat source can flow into lens support 27 and adhesive 18 and produce distortion of these elements. Similar distortions can result from vibrational forces, as discussed above. The distortion may produce a bending of lens support 27 which can affect the alignment of lens 19, or cause an expansion in adhesive 17 and shift lens 29 relative to laser device 11. It can be appreciated by one skilled in the art that the operational performance of a conventional laser system comprising a beam-shaping lens, as exemplified by laser assemblies 10 and 20, is adversely affected by the internal distortions produced by waste heat flowing into the lens support elements or by a vibrational environment.

Figure 3:
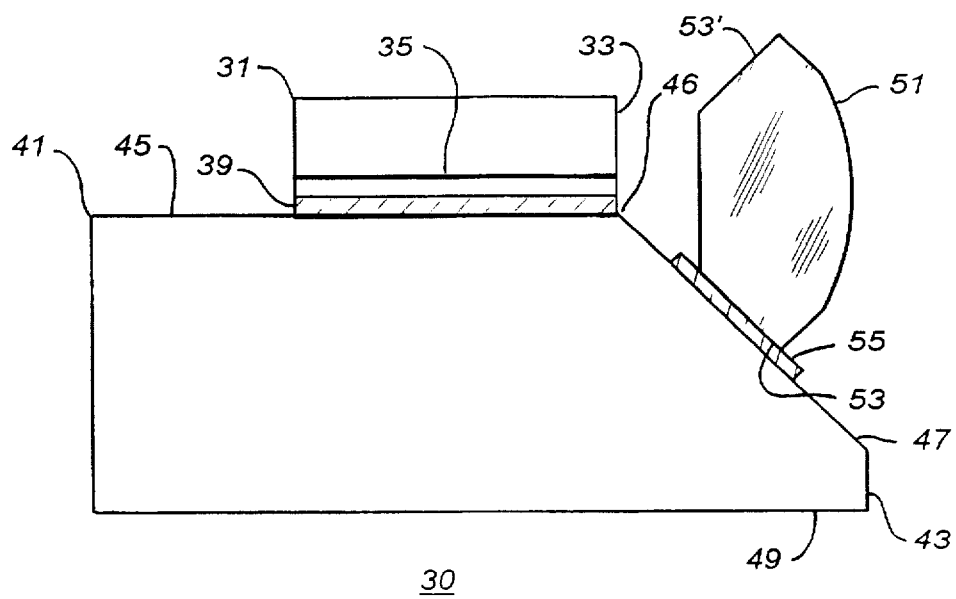
FIG. 3 is a diagrammatical side elevation view of a semiconductor laser assembly according to the present invention, comprising a heatsink, a laser device attached to a mounting surface of the heatsink, and a beam-shaping lens attached to an oblique surface of the heatsink.

FIG. 3 is a diagrammatic illustration of an embodiment of a laser assembly 30 according to the present invention. Laser assembly 30 comprises a laser device 31 secured to the mounting surface 45 of a heatsink 41, preferably by means of a bonding material 39. Heatsink 41 comprises a thermally-conductive material such as a tungsten-copper or a molybdenum-copper alloy. Alternatively, heatsink 41 can comprise a material such as silicon or cubic boron nitride, so as to minimize the difference in the thermal expansion coefficients of heatsink 41 and of laser device 31. Laser device 31 can be a single source, such as a laser diode, or a multiple source, such as an array of semiconductor lasers. Preferably, laser device 31 is oriented with active layer 35 proximate mounting surface 45 as shown, although the invention can be practiced with laser device 31 in another orientation. Heatsink 41 comprises an oblique surface 47 which intersects mounting surface 45 at a common edge 46 to form an obtuse dihedral angle. Oblique surface 47 may extend to a front surface 43 as shown, or alternatively, to a bottom surface 49. Laser device 31 is positioned with an output facet 33 located approximately at common edge 46, as described in greater detail below.

A beam-shaping lens 51 is mounted onto oblique surface 47 by a thin layer of adhesive 55. Lens 51 is shown as a plano-convex lens for purpose of illustration only, and the present invention should not be construed as being limited to any particular lens configuration. Lens 51 generally comprises a toroidal lens when laser device 31 is a single source, and generally comprises a cylindrical lens when laser device 31 is a multiple source. Lens 51 fuither comprises a canted attachment surface 53 to provide for mounting to oblique surface 47. In a preferred embodiment, laser device 31 comprises a linear diode array and lens 51 comprises a cylindrical lens fabricated by a drawing method, as commonly practiced in the relevant art. When configured as a cylindrical lens, lens 51 may further comprise a second canted surface 53'. Canted surface 53' is provided to produce a symmetrical cross section for lens 51 and need not necessarily be used for attachment purposes. As is well-known in the relevant art, a symmetrical cross section can provide for a more uniform drawing process during the fabrication of a cylindrical lens.

By mounting lens 51 on heatsink 41 as shown, several advantages are realized. Because waste heat flowing throughout heatsink 41 will produce negligible distortion at oblique surface 47, the optimal positioning secured for lens 51 will not be affected. Additionally, the disclosed configuration provides for a greater structural integrity than a conventional laser assembly as there is a reduced number of degrees of freedom between lens 51 and laser device 31. Furthermore, lens 51 can be made very small, with a resultant decrease in wavefront aberration.

Figure 4:
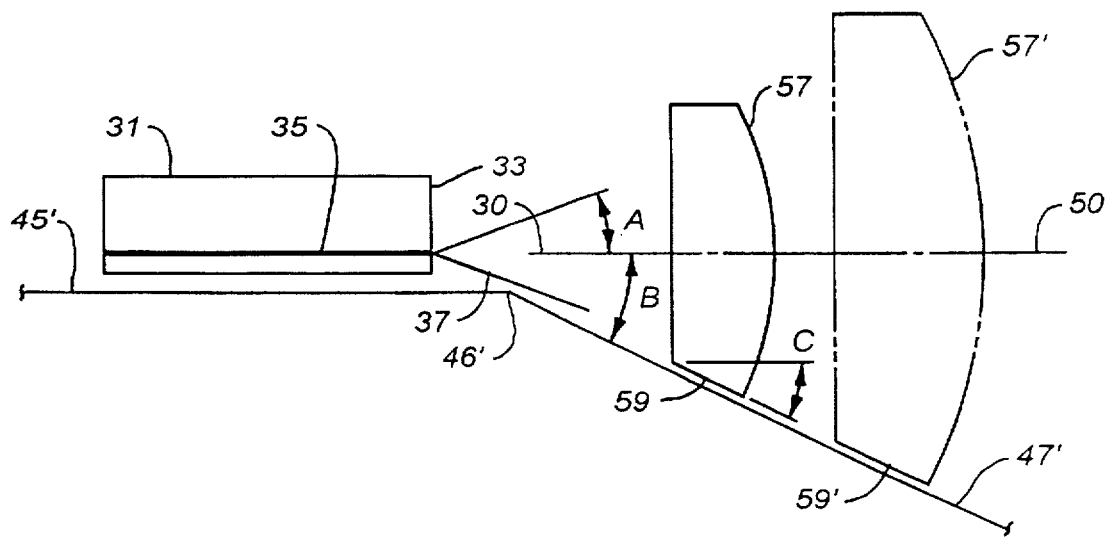
FIG. 4 is a diagram illustrating the geometric relationships between the beam-shaping lens, the laser device, and the oblique heatsink surface of a laser assembly according to the present invention.

Lens positioning criteria are illustrated in FIG. 4 in which there is shown laser device 31 emitting radiation 37 of half-angle A and directed along an emission plane of symmetry 30. Both the plane of active layer 35 and emission plane of symmetry 30 are set parallel to a mounting surface 45'. There is also shown an oblique surface 47' oriented at an angle of declination B with respect to emission plane of symmetry 30. Oblique surface 47' intersects mounting surface 45' at a common edge 46' to form an obtuse dihedral angle of 180°—B. Preferably, laser device 31 is positioned such that the plane of oblique surface 47' intersects output facet 33 at active layer 35. This positioning can be adequately achieved in practice by placing laser 31 such that output facet 33 is proximate common edge 46'. Angle of declination B will generally be no larger than half-angle A so that occlusion of output beam 37 by oblique surface 47' is minimized.

Output beam 37 is incident upon a beam-shaping lens 57 placed such that the optical plane of symmetry 50 of lens 57 is coincident with emission plane of symmetry 30. Lens 57 comprises a canted attachment surface 59 oriented at a cant angle C with respect to optical plane of symmetry 50. Alternatively, lens 57 may comprise a second canted surface (not shown), similar to second canted surface 53' in FIG. 3, above. In FIG. 4, cant angle C is set equal to angle of declination B. Thus, by positioning canted attachment surface 59 against oblique surface 47', optical plane of symmetry 50 of lens 57 is placed into parallel relationship with emission plane of symmetry 30. By translating lens 57 along oblique surface 47', the positioning of lens 57 can be adjusted until output beam 37 is being modified as desired.

It can be appreciated by one skilled in the relative art that lens 57, which can be viewed as a short cantilever element, has but a single degree of freedom with respect to laser device 31. A vibrational environment may impart a negligible movement of lens 57 about attachment surface 59. However, because lens 57 is mounted directly on the laser heatsink, there will occur effectively no movement of lens 57 with respect to laser device 31, even under thermal gradient conditions. Consequently, as can be appreciated by one skilled in the relevant art, the disclosed configuration will be more rugged and stable than the conventional laser assembly configurations described above.

As noted above, there can result dimensional differences among drawn cylindrical lenses which otherwise have proportional cross sectional shapes. Such differences are readily accommodated in the disclosed configuration. For example, if the lens fabrication process has produced a lens 57', comprising proportionately greater cross-sectional dimensions than lens 57 (the differences exaggerated in the figure for clarity), canted attachment surface 59' can be placed against oblique surface 47', as shown, and lens 57' can be translated along oblique surface 47' to bring optical plane of symmetry 50 of lens 57' into coincidence with emission plane of symmetry 30, as desired. In an alternative configuration, both lens 57 and a second lens 57' of a different type, can be mounted on surface 47'.

Figure 5:
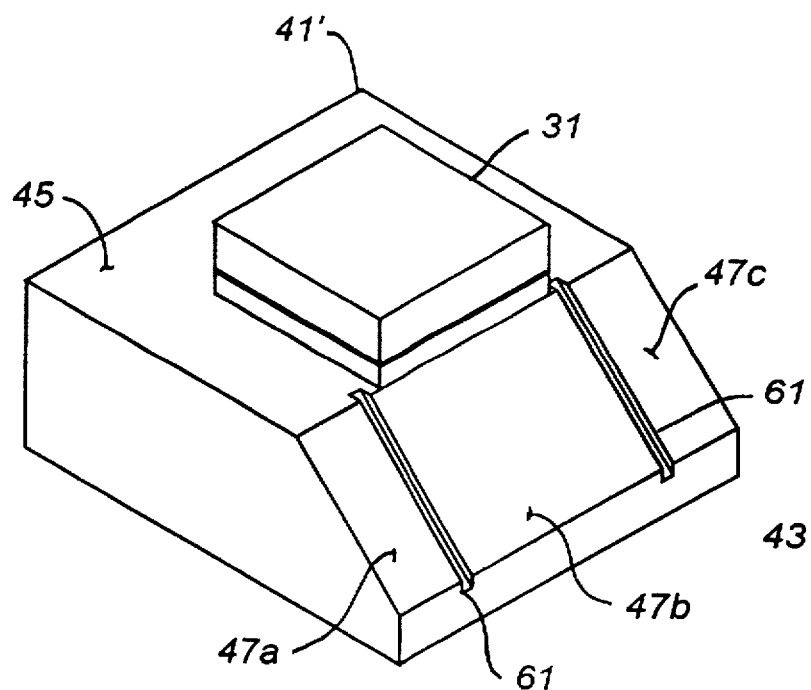
FIG. 5 is a diagrammatical isometric view of an alternative embodiment of the heatsink of FIG. 3 comprising grooves in the oblique surface.

With reference to FIG. 3, oblique surface 47 forms an obtuse dihedral angle of approximately 135° with mounting surface 45 in a preferred embodiment. Beam-shaping lens 51 comprises a focal length of about 0.314 mm and is positioned approximately 0.110 mm from output facet 33. In an alternative embodiment, laser device 31 is mounted on a grooved heatsink 41', as shown in FIG. 5. Heatsink 41' comprises grooves 61 which form mounting surfaces 47a, 47b, and 47c. A beam-shaping lens (not shown, for clarity) is attached to heatsink 41' by application of bonding material to mounting surfaces 47a and 47c only. No bonding material is applied to mounting surface 47b, which is proximate to laser device 31. Grooves 61 serve to reduce or eliminate the movement of bonding material onto mounting surface 47b when a beam-shaping lens is attached and thus prevent the possible occlusion of emitted radiation by bonding material.

The present invention is advantageously adapted to provide a laser assembly lens support which is largely unaffected by the adverse effects of waste heat and external vibrational forces. While there have been described preferred embodiments of the present invention, it will be readily apparent to those skilled in the art that various changes and modifications may be made therein without departing from the invention, and it is intended in the wording of the appended claims to include such changes and modifications as would be encompassed by the true spirit and scope of the invention. As will be appreciated by those skilled in the relevant art, the embodiments described are not meant to be interpreted in a limiting sense.

What is claimed is:

1. A laser assembly, comprising:
   a heatsink comprising a mounting surface and an oblique surface intersecting said mounting surface at a common edge to form an obtuse dihedral angle, such that heat flowing throughout said heatsink produces negligible distortion at said oblique surface;
   a laser comprising an output facet, said laser attached to said mounting surface and positioned such that said output facet is located approximately at said common edge; and
   at least one beam-shaping lens optically coupled to the output of said laser, said beam-shaping lens comprising a canted attachment surface such that, when said canted attachment surface is attached to said oblique surface, the optical plane of symmetry of said beam-shaping lens is placed into parallel relationship with the emission plane of symmetry of said laser, such that there results effectively no movement of said beam-shaping lens with respect to said laser when said laser assembly is subjected to heat and vibrational forces.

2. The laser assembly of claim 1 wherein said at least one beam-shaping lens comprises a toroidal lens.

3. The laser assembly of claim 1 wherein said at least one beam-shaping lens comprises a cylindrical lens.

4. The laser assembly of claim 1 wherein said laser comprises a laser diode.

5. The laser assembly of claim 1 wherein said laser comprises an array of semiconductor lasers.

6. The laser assembly of claim 1 wherein said laser is further positioned such that the plane of said oblique surface intersects said output facet at the active layer of said laser.

7. The laser assembly of claim 1 wherein said at least one beam-shaping lens further comprises a second canted attachment surface.

8. The laser assembly of claim 1 wherein said obtuse dihedral angle is substantially 135°.

9. The laser assembly of claim 1 wherein said at least one beam-shaping lens comprises a focal length of substantially 0.314 mm.

10. The laser assembly of claim 1 wherein said oblique surface comprises at least one groove.

11. A laser assembly, comprising:
    a heatsink comprising a mounting surface and an oblique surface intersecting said mounting surface at a common edge to form an obtuse dihedral angle, such that heat flowing throughout said heatsink produces negligible distortion at said oblique surface;
    a laser diode comprising an output facet, said laser diode attached to said mounting surface and positioned such that said output facet is located approximately at said common edge; and
    at least one toroidal lens, said toroidal lens comprising a canted attachment surface attached to said oblique surface such that the optical plane of symmetry of said toroidal lens is thereby placed into parallel relationship with the emission plane of symmetry of said laser diode such that there results effectively no movement of said toroidal lens with respect to said laser diode when said laser assembly is subjected to heat and vibrational forces.

12. The laser assembly of claim 11 wherein said oblique surface comprises at least one groove.

13. A laser assembly, comprising:
    a heatsink comprising a mounting surface and an oblique surface intersecting said mounting surface at a common edge to form an obtuse dihedral angle. such that heat flowing throughout said heatsink produces negligible distortion at said oblique surface;

an array of semiconductor lasers. each said laser comprising an output facet. said array of lasers attached to said mounting surface and positioned such that said output facets are located approximately at said common edge; and at least one cylindrical lens. said cylindrical lens comprising at least one canted attachment surface. said canted attachment surface further attached to said oblique surface such that the optical plane of symmetry of said cylindrical lens is thereby placed into parallel relationship with the emission plane of symmetry of said array of semiconductor lasers such that there results effectively no movement of said cylindrical lens with respect to said array of semiconductor lasers when said laser assembly is subjected to heat and vibrational forces.

14. The laser assembly of claim 13 wherein said oblique surface comprises at least one groove.

15. The laser assembly of claim 13 wherein said obtuse dihedral angle is substantially 135°.

16. The laser assembly of claim 13 wherein said cylindrical lens comprises a focal length of substantially 0.314 mm.

* * * * *